United States Patent
Kurek, III et al.

[11] Patent Number: 5,887,927
[45] Date of Patent: Mar. 30, 1999

[54] FOLDING HANDLE DEVICE

[75] Inventors: Edward A. Kurek, III, Birdsboro; Marty Morrison, West Chester, both of Pa.

[73] Assignee: Southco, Inc., Concordville, Pa.

[21] Appl. No.: 942,148

[22] Filed: Oct. 1, 1997

[51] Int. Cl.⁶ ................................................. E05B 7/00
[52] U.S. Cl. ........................... 294/158; 294/169; 16/112; 16/126
[58] Field of Search ................................. 294/158, 169; 16/110 R, 112, 126; 190/39, 115–118; 292/257, 256.75

[56] References Cited

U.S. PATENT DOCUMENTS

| | | | |
|---|---|---|---|
| D. 322,665 | 12/1991 | Bobrovniczky | D23/324 |
| D. 322,666 | 12/1991 | Bobrovniczky | D23/324 |
| D. 336,783 | 6/1993 | Hopkins et al. | D4/118 |
| D. 352,885 | 11/1994 | Holtman | D8/331 |
| D. 373,716 | 9/1996 | Keys et al. | D8/107 |
| D. 376,743 | 12/1996 | Seber et al. | D8/99 |
| D. 376,965 | 12/1996 | Spear et al. | D8/10 |
| D. 377,433 | 1/1997 | Funk et al. | D6/596 |
| D. 382,190 | 8/1997 | Blackston et al. | D8/107 |
| D. 383,048 | 9/1997 | Sorensen et al. | D8/107 |
| 2,270,923 | 1/1942 | Birdsall | 16/126 |
| 3,082,473 | 3/1963 | West | 16/126 |
| 3,361,465 | 1/1968 | Dobbs | 292/257 |
| 3,562,849 | 2/1971 | Brayshaw | 16/126 |
| 3,909,180 | 9/1975 | Von Holdt | 292/257 |
| 3,967,848 | 7/1976 | Sowle | 294/31.2 |
| 4,011,913 | 3/1977 | Davies, III et al. | 172/42 |
| 4,021,994 | 5/1977 | Mainprice | 43/390 |
| 4,023,221 | 5/1977 | Cadman | 7/1 R |
| 4,044,365 | 8/1977 | Pizzuti et al. | 354/85 |
| 4,062,564 | 12/1977 | Schimmeyer | 280/652 |
| 4,100,715 | 7/1978 | Ganz | 53/48 |
| 4,160,353 | 7/1979 | Ganz | 53/393 |
| 4,163,352 | 8/1979 | Ganz | 53/393 |
| 4,361,916 | 12/1982 | McDaniel | 5/62 |
| 4,545,558 | 10/1985 | Crudele | 248/544 |
| 4,744,272 | 5/1988 | Leatherman | 81/427.5 |
| 4,844,527 | 7/1989 | Ray | 294/19 |
| 4,899,417 | 2/1990 | Schaffer et al. | 15/230.11 |
| 4,985,994 | 1/1991 | Tavolieri | 30/47 |
| 5,085,433 | 2/1992 | Parsons | 273/84 R |
| 5,191,837 | 3/1993 | Bolton | 101/333 |
| 5,285,981 | 2/1994 | Pavelka | 242/86.5 |
| 5,347,718 | 9/1994 | Turner | 30/122 |
| 5,368,347 | 11/1994 | Holtman et al. | 292/257 |
| 5,398,375 | 3/1995 | Niederquell | 16/112 |
| 5,467,503 | 11/1995 | Nolte et al. | 16/115 |
| 5,479,739 | 1/1996 | Livingston | 43/12 |
| 5,490,688 | 2/1996 | Cheng | 280/655 |

(List continued on next page.)

OTHER PUBLICATIONS

Southco "Swell Latch" publication, 1993.

*Primary Examiner*—Dean Kramer
*Attorney, Agent, or Firm*—Paul & Paul

[57] ABSTRACT

A folding handle device is disclosed, mountable to an article to be carried, having a rotatable U-shaped handle with leg members adaptable to pivotally receive a mounting shaft, each leg member having a base having planar surfaces in which the handle be held upright or folded. The device further includes two mounting shafts rotatably mounted to the handle through apertures in a planar mounting surface and are retained in place by a nut. A spring between the nut and the bottom side of the mounting surface bias the mounting shaft away from the bottom side of the planar mounting surface. The handle is adapted to facilitate axial movement of the shafts relative to and perpendicular to the planar mounting surface as the handle is rotated between the upright and folded positions, wherein when the handle is either in the upright position or folded position, the spring is under a compressive load, and during the transition from the upright to folded positions and the transition from folded to upright positions, the spring is under a greater compressive load than that when the handle is in the upright position or folded position.

16 Claims, 5 Drawing Sheets

U.S. PATENT DOCUMENTS

| | | | |
|---|---|---|---|
| 5,496,054 | 3/1996 | Wu | 280/646 |
| 5,502,895 | 4/1996 | Lemaire | 30/158 |
| 5,505,304 | 4/1996 | Broskow et al. | 206/427 |
| 5,511,310 | 4/1996 | Sessions et al. | 30/161 |
| 5,513,864 | 5/1996 | Huang | 280/47.36 |
| 5,515,610 | 5/1996 | Levin et al. | 30/161 |
| 5,522,138 | 6/1996 | Betts, Jr. | 30/160 |
| 5,522,648 | 6/1996 | Wilen | 300/21 |
| 5,535,483 | 7/1996 | Cabagnero | 16/115 |
| 5,536,033 | 7/1996 | Hinkston | 280/624 |
| 5,542,322 | 8/1996 | Knox et al. | 81/177.6 |
| 5,542,560 | 8/1996 | Gerster et al. | 220/252 |
| 5,547,205 | 8/1996 | do Rosario Sousa de Cabedo | 280/30 |
| 5,557,811 | 9/1996 | Hoff | 4/502 |
| 5,560,082 | 10/1996 | Vetter | 16/115 |
| 5,564,318 | 10/1996 | Pail | 81/427.5 |
| 5,572,793 | 11/1996 | Collins et al. | 30/157 |
| 5,573,489 | 11/1996 | Letendre et al. | 493/194 |
| 5,581,834 | 12/1996 | Collins | 7/118 |
| 5,581,888 | 12/1996 | Lewis | 30/123.3 |
| 5,581,915 | 12/1996 | Lobato | 37/285 |
| 5,582,372 | 12/1996 | Wu | 248/96 |
| 5,590,473 | 1/1997 | Wang | 30/512 |
| 5,590,921 | 1/1997 | Holtman et al. | 292/257 |
| 5,596,808 | 1/1997 | Lake et al. | 30/161 |
| 5,599,351 | 2/1997 | Haber et al. | 606/167 |
| 5,615,484 | 4/1997 | Pittman | 30/161 |
| 5,620,127 | 4/1997 | MacKenzie | 224/555 |
| 5,628,117 | 5/1997 | Glesser | 30/298.4 |
| 5,630,524 | 5/1997 | Badura | 220/403 |
| 5,630,776 | 5/1997 | Yang | 482/104 |
| 5,632,713 | 5/1997 | Canning et al. | 493/162 |
| 5,641,296 | 6/1997 | Larabell et al. | 439/342 |
| 5,644,848 | 7/1997 | Totten | 30/450 |
| 5,647,095 | 7/1997 | Takimoto | 16/112 |
| 5,647,129 | 7/1997 | Stamper | 30/139 |
| 5,649,364 | 7/1997 | Ilanlou | 30/40.2 |
| 5,655,728 | 8/1997 | Yang | 242/395.1 |
| 5,657,543 | 8/1997 | Collins | 30/367 |
| 5,662,131 | 9/1997 | Scarborough et al. | 135/65 |

FOLDING HANDLE DEVICE

The present invention relates to a folding handle device, where the handle may be held securely in either an opened or closed position.

BACKGROUND OF THE INVENTION

This invention pertains to the art of handles and handle assemblies and more particularly to an improvement in a handle for mounting on an article where the handle may be securely held in an opened position where the handle is accessible, or in a folded position where the handle is securely stored.

The principal object of the present invention is to provide a handle which may be securely held in either an opened or closed position.

SUMMARY OF THE INVENTION

It is a primary object of the present invention to provide a folding handle device which can be rotated and securely held in either a folded, stored position, or an opened, upright position by sufficient force such that the handle stays in position despite vibrations or minor jarring or shaking of the handle itself or the article to which the handle is attached.

It is accordingly an object of the present invention to provide a new and improved folding handle device that may be securely stored in at least either a folded, stored position, and an opened, upright position.

It is a further object of the present invention to provide a new and improved folding handle device that may be securely stored in at least either a folded, stored position, and an opened, upright position, that is simple in design.

It is a further object of the present invention to provide a new and improved folding handle device that may be securely stored in at least either a folded, stored position, and an opened, upright position, that is simple in design and requires a minimum number of separate parts.

The present invention is directed to a folding handle mountable to an article to be carried, the article having a generally planar mounting surface having top and bottom sides. The folding handle comprises a rotatable U-shaped handle having two leg members and a spanning member connecting the leg members, each leg member having a means adaptable to pivotally receive a mounting shaft. Each leg member has a base having planar surfaces that enable the base to sit flush against the planar mounting surface in a plurality of positions, including a position in which the handle is upright and including a position in which the handle is folded parallel to the mounting surface. Two mounting shafts, each having a pivot end and a retaining end, are rotatably mounted to a base of the handle at the pivot end of the mounting shaft. The retaining ends of the mounting shafts mount through apertures in the planar mounting surface such that the handle is on the top side of the mounting surface and the retaining ends of the mounting shafts protrude through the bottom side of the mounting surface and are retained in place by a retaining means to captivate the handle to the planar mounting surface. Biasing means are used between the retaining ends of the mounting shafts and the bottom side of the mounting surface, to bias the retaining ends of the mounting shaft away from the bottom side of the planar mounting surface. Finally, the handle is adapted to facilitate axial movement of the shafts relative to and perpendicular to the planar mounting surface as the handle is rotated between the upright and folded positions, wherein when the handle is either in the upright position or folded position, the biasing means is under a compressive load, and during the transition from the upright to folded positions, and the transition from folded to upright positions, the biasing means is under a greater compressive load than that when the handle is in the upright position or folded position.

DESCRIPTION OF THE PREFERRED EMBODIMENT

Figure 1:
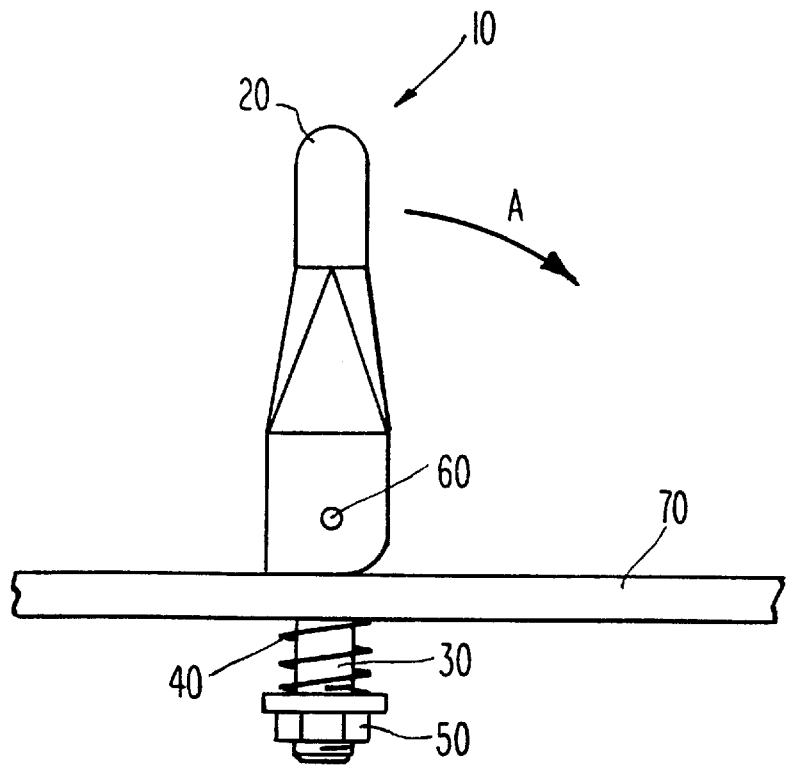
FIG. 1 is a side elevational view of a first embodiment of a folding handle device comprising the present invention, with the handle in an opened, upright position.
Figure 2:
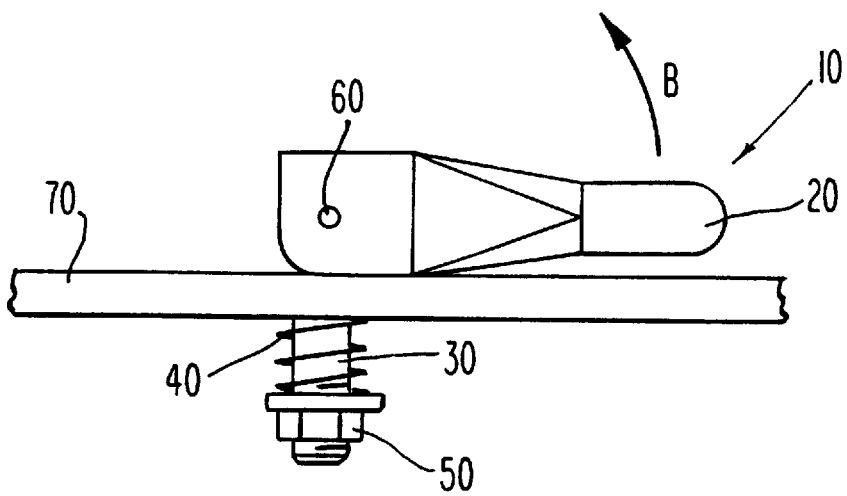
FIG. 2 is a side elevational view of the embodiment of FIG. 1, with the handle in the closed or folded position.
Figure 3:
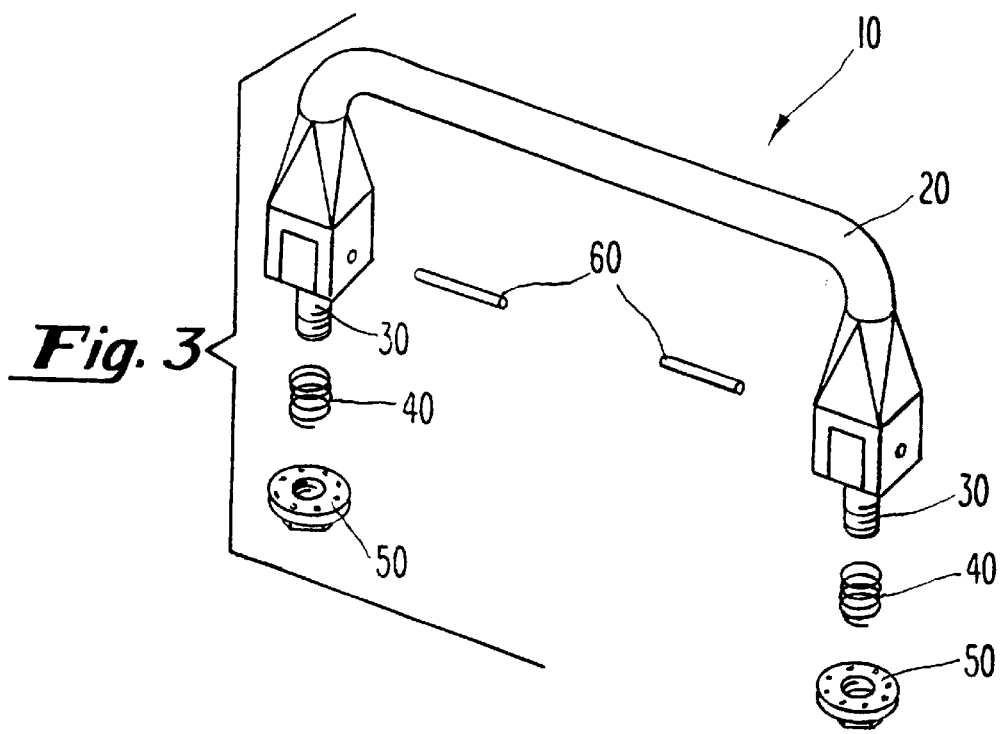
FIG. 3 is a partially exploded perspective view of the handle of FIG. 1.

Referring now in detail to the drawings, wherein like reference numerals indicate like elements throughout the several views, there is shown in FIGS. 1 through 3 a folding handle device 10 in accordance with a preferred embodiment of the present invention. The folding handle device 10 has a rotatable handle 20, a mounting shaft 30, a biasing means or spring 40, and a retaining means 50.

Figures 4, 5:
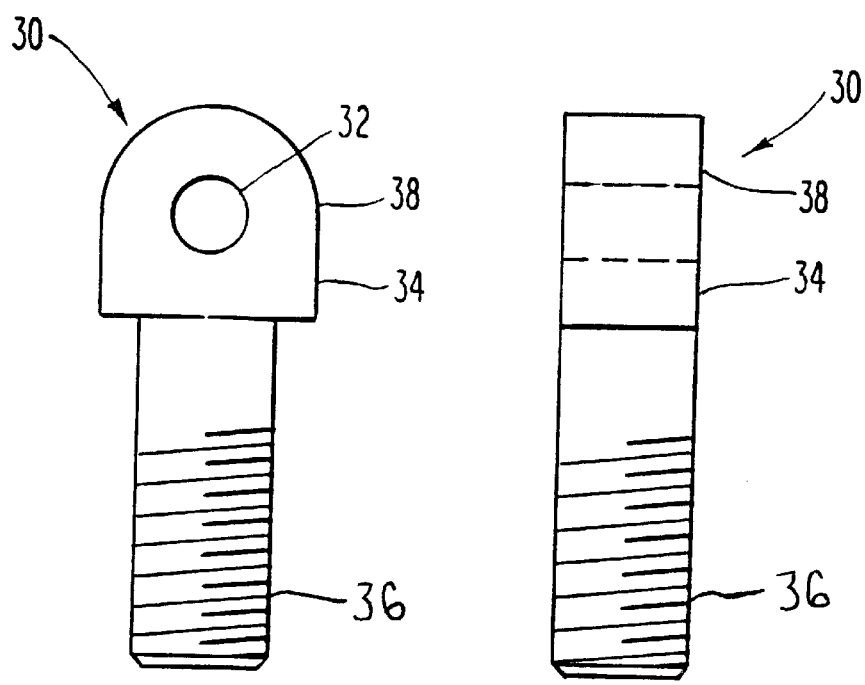
FIG. 4 is a side elevational view of a mounting shaft as used in the embodiment of FIG. 1.
FIG. 5 is a front elevational view of the shaft of FIG. 4.
Figure 6:
FIG. 6 is a front view of a groove pin as used in the embodiment of FIG. 1.
Figure 8:
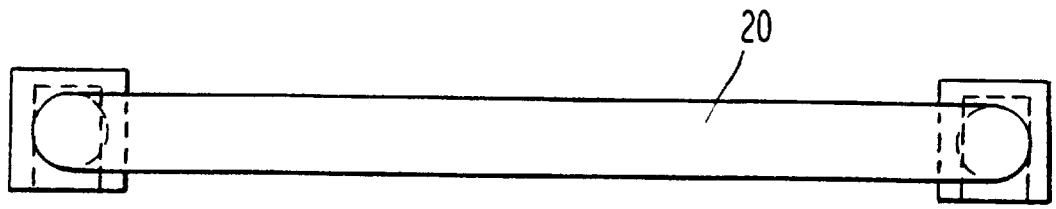
FIG. 8 is a plan view of the handle of FIG. 7.
Figure 7:
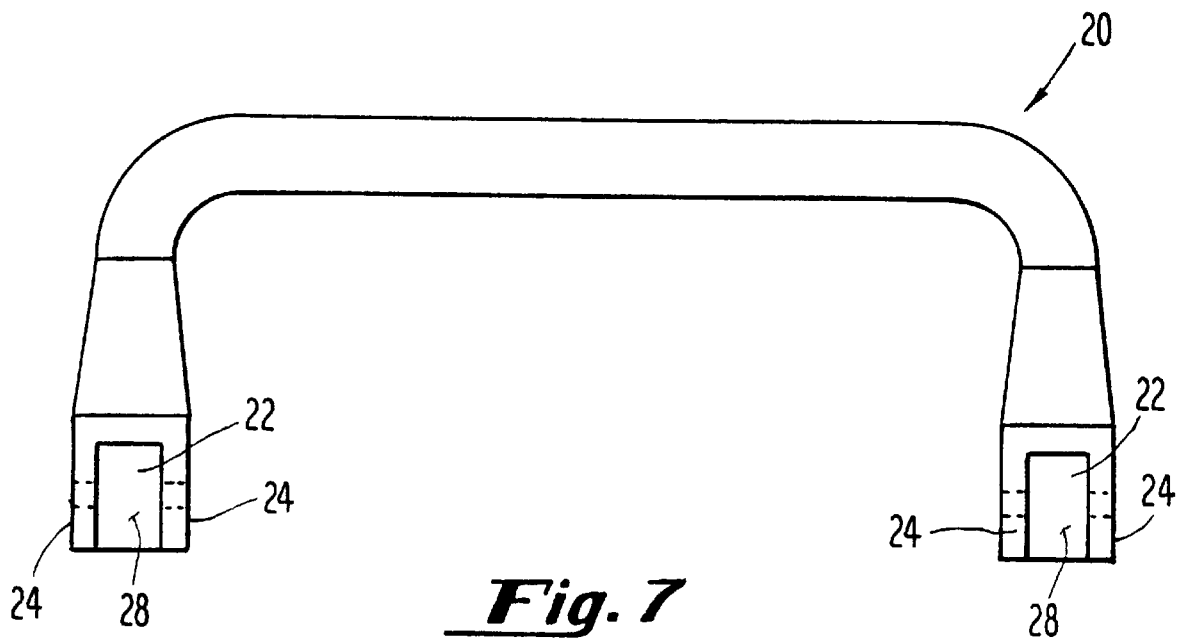
FIG. 7 is a front elevational view of a handle as used in the embodiment of FIG. 1.

Mounting shaft 30 is rotatably attached to rotatable handle 20. As can be seen in FIGS. 4 and 5 which show front and side views of a mounting shaft 30 suitable for use in the current embodiment, an aperture 32 is provided through the head 34 of the mounting shaft 30. As can best be seen in FIG. 7 which depicts a front elevational view of the rotatable handle 20 of the present embodiment of this invention, rotatable handle 20 has cavities 22 adapted to receive the head 34 of the mounting shaft 30. The cavities 22 of the rotatable handle 20 create side walls 24 each of which is provided with aperture 26. Apertures 26 in the rotatable handle 20 align with aperture 32 in the head 34 of mounting shaft 30 such that a pivot means such as pivot pin 60 (See FIG. 3), such as groove pin 60 as shown in FIG. 6, may be installed to rotatably secure the mounting shaft 30 to the rotatable handle 20. The cavities 22 of the rotatable handle 20 also preferably create back wall 28 of rotatable handle 20 which limits rotation of rotatable handle 20 with respect to the mounting shaft 30 to preferably approximately ninety degrees.

The folding rotatable handle device 10 is adapted to be mounted on an article having a planar mounting surface 70. The mounting shaft 30 is rotatably coupled at one end, the pivot end 38, of the mounting shaft 30 to the rotatable handle 20 as described above, allowing the rotatable handle 20 to rotate with respect to the mounting shaft 30 for preferably approximately ninety degrees. The end of the mounting shaft 30 opposite the pivot point, the retaining end 36, is threaded and is designed to protrude through an aperture in the planar mounting surface 70 on which the folding handle device 10 is mounted. Once the mounting shaft 30 is passed through the aperture in the planar mounting surface, the biasing means or spring 40 is placed around the mounting shaft 30 and a retaining means such as the nut 50 shown in FIG. 1. is threaded onto mounting shaft 30 to secure the handle device to the planar mounting surface and the spring 40 between the planar mounting surface and retaining means 50.

The rotatable handle 20 of the folding handle device 10 may be securely stored in either an opened, upright position, as depicted in FIG. 1, or a closed, stored position, as depicted in FIG. 2. By applying a rotational force in direction A, as depicted in FIG. 1, rotatable handle 20 may be moved from an upright position to a stored position. Alternatively, by applying a rotational force in direction B, as depicted in FIG. 2, rotatable handle 20 may be moved from the stored position to the upright position. The nut 50 is positioned on the mounting shaft 30 by rotating it either clockwise or counterclockwise to the desired spring force required for the retaining the rotatable handle 20 in place. As the nut 50 is rotated clockwise on the mounting shaft 30, spring force increases. As the nut 50 is rotated counterclockwise on the mounting shaft 30, spring force decreases.

When moving rotatable handle 20 from the upright position (FIG. 1) to stored position (FIG. 2), the increased force is created by a camming means 21 (see FIGS. 9, 1, and 2) integral to rotatable handle 20. As rotatable handle 20 is rotated in the direction of arrow A as shown in FIG. 1, the camming means 21 created by a radius on each of walls 24, causes the pivot point of the rotatable handle 20 to move away from the mounting surface 70, thus moving the retaining end 36 of the mounting shaft 30 axially toward the handle. Then, after the pivot point passes the peak point on the cam, the retaining end 36 of the mounting shaft moves axially away from the handle 20. This movement increasingly compresses spring 40 until a point of maximum compression when the pivot point is positioned at a farthest point form mounting surface 70. The spring force then decreases as the handle 20 continues to rotate until it is the folded position.

Figure 9:
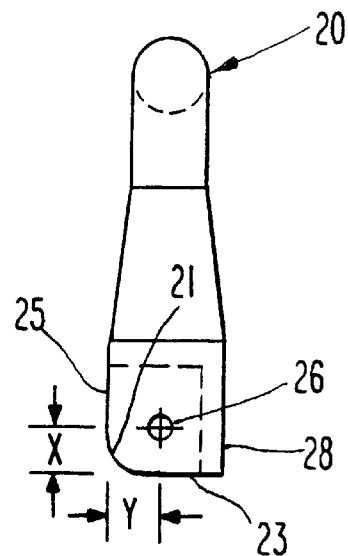
FIG. 9 is a side elevational view of the handle of FIG. 7.

Preferably, the pivot point is located such that it is equidistant from bottom surface 23 of rotatable handle 20 and side surface 25 of rotatable handle. That is, as depicted in FIG. 9, the distance X is approximately equal to the distance Y. A smooth radius of smaller diameter than the distance X or Y creates a proper camming action whereby a greatest amount of force is required approximately midway between the stored position and the upright position of the rotatable handle 20. By designing the folding handle in this manner, equal force is required to move the rotatable handle from stored to upright position as is required to move the rotatable handle from the upright to stored position.

Additionally by designing the distance X to be equal to Y, an equivalent amount of holding force holds the rotatable handle in place in either the upright or folded positions.

Several modifications to the above design are contemplated, that may be advantageous in certain circumstances.

Figure 10:
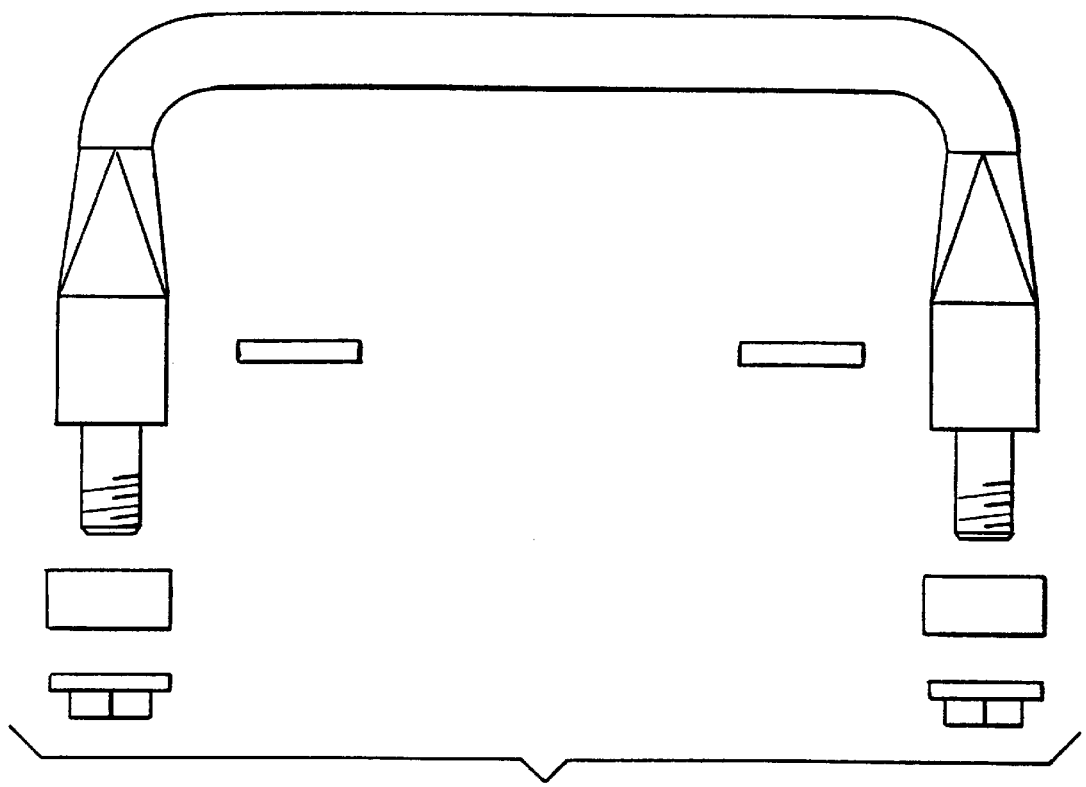
FIG. 10 is a partially exploded front elevational view of an alternate embodiment of the folding handle device of the present invention.
Figure 11:
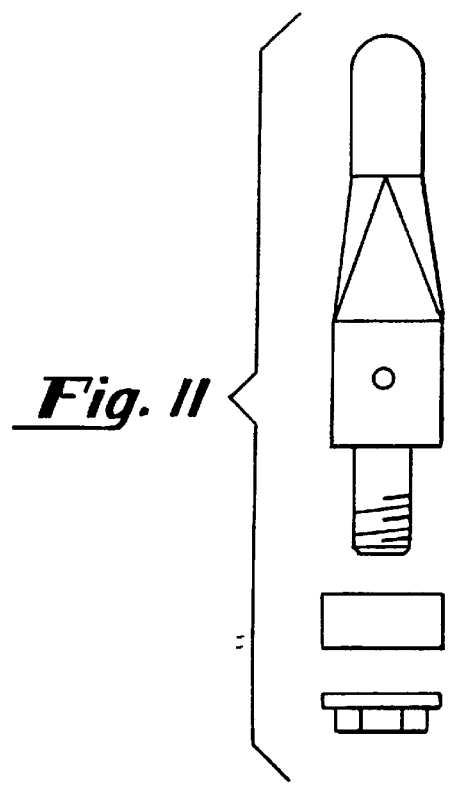
FIG. 11 is a partially exploded side elevational view of the handle device of FIG. 10.

The biasing means may comprise any means in the art that is capable of providing the spring force necessary to hold the handle 20 in position. For example, as shown in FIGS. 10 and 11, the biasing means may be a cylindrical neoprene grommet. An advantage here is further damping and quiet and smooth operation.

While it is anticipated that the most useful geometry of the present invention is for the rotatable handle having two positions, upright (ninety degrees) and stored (zero degrees), other special applications might require the rotatable handle have set positions at other positions, or perhaps multiple positions with one hundred eighty degrees or perhaps greater rotational movement. By varying the camming surface on the rotatable handle 20 to include one or more flat surfaces at various locations, a great amount of combinations can be used.

Figure 12:
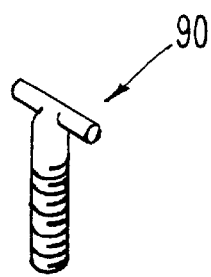
FIG. 12 is a perspective view of a combined mounting shaft and pivot pin as used in a second alternate embodiment of the present invention.
Figure 12A:
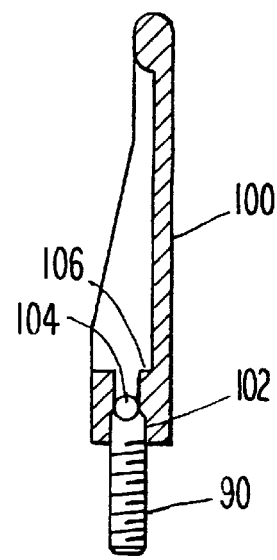
FIG. 12A is a sectional front elevational view of a second alternate embodiment of the folding handle device of FIG. 1 depicting the combined hinge and mounting shaft of FIG. 12.

The mounting shaft and pivot pin can be incorporated into one integral part 90 as shown in FIGS. 12 and 12A. Here, a modification to the base of the handle, as shown in FIG. 12A is required where the base of the handle 102 is designed to accommodate the T-shaped integral mounting shaft and pin 90 by installation through the top 106 of the base of the handle through a hole to rest in a pair of grooves 104 in the base of the handle 102.

Figure 13:
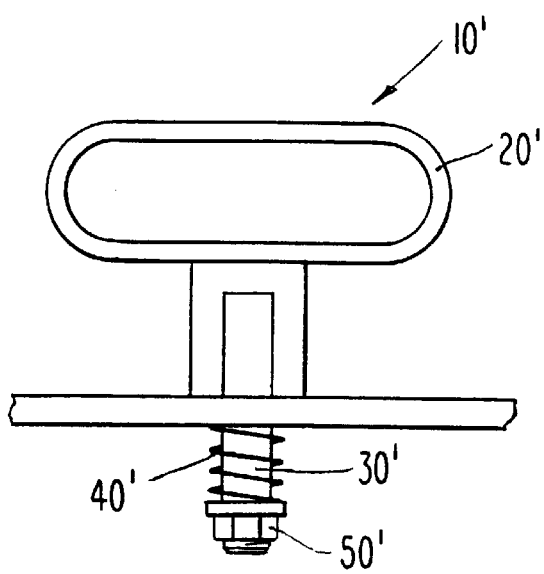
FIG. 13 is a front elevational view of a third alternate embodiment of the folding handle device of the present invention.

The above embodiments address a U-shaped rotatable handle with two points of attachment to a mounting surface. The present invention is also applicable to a rotatable handle having a single point of attachment 10' such as that depicted in FIG. 13. With the exception of the rotatable handle 20' itself, this design uses substantially the same basic components as that of the U-shaped rotatable handle 10 design, including a mounting shaft 30', a biasing means or spring 40', a retaining means or nut 50' and a pivot means, such as pivot pin 60. However, only one mounting shaft, spring, nut and pivot pin are required, rather than two.

Figure 14:
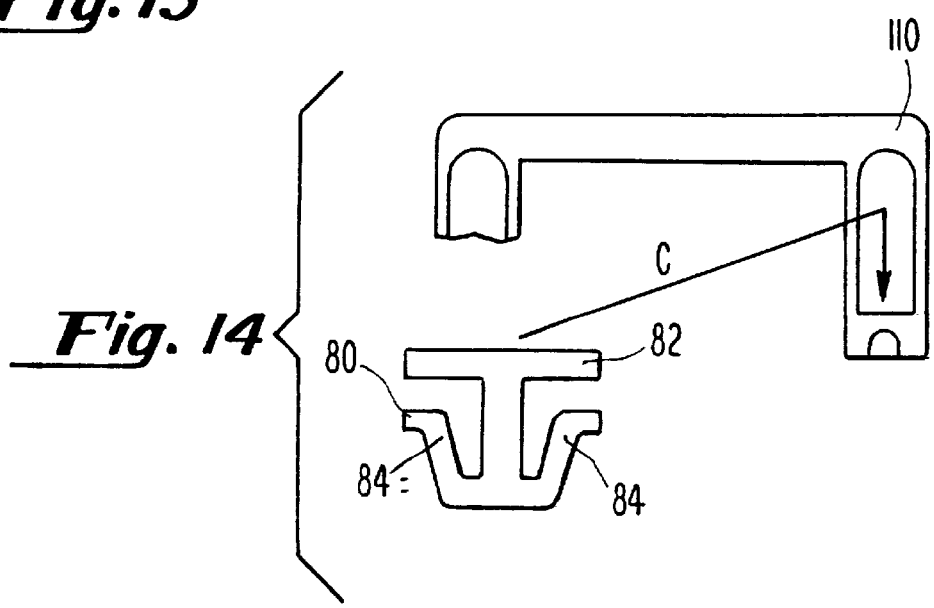
FIG. 14 is a partially exploded side elevational view, of a fourth alternate embodiment of the folding handle device of the present invention.

Finally, an alternative embodiment is depicted in FIG. 14 where the hinge pin, the mounting shaft, and the biasing means are all a single integral part 80. As in the embodiment of FIGS. 12 and 12A, a modified handle 110 is required that provides for the base of the handle to rotatably support the pin 82 in the handle. As in FIG. 12A, the combined part 80 is installed through the top of the base of the handle 110 as shown by arrow C. Curved members 84 act as both spring and retaining means to hold the handle in place against a planar mounting surface and to provide a spring force against that surface.

It will be recognized by those skilled in the art that changes may be made in the above described embodiments of the invention without departing from the broad inventive concepts thereof. It is understood, therefore, that this invention is not limited to the particular embodiments disclosed, but is intended to cover all modifications which are within the scope and spirit of the invention as defined by the appended claims.

We claim:

1. A folding handle device, mountable to an article to be carried, the article having a generally planar mounting surface having top and bottom sides, the folding handle comprising:
   (a) a rotatable U-shaped handle having two leg members and a spanning member connecting the leg members, each leg member having a means adaptable to pivotally receive a mounting shaft, each leg member having a base having planar surfaces that enable the base to sit flush against the planar mounting surface in a plurality of positions, including a position in which the handle is upright and including a position in which the handle is folded parallel to the mounting surface;
   (b) two mounting shafts, each having a pivot end and a retaining end, each mounting shaft rotatably mounted to a base of the handle at the pivot end of the mounting shaft;
   (c) the retaining ends of the mounting shafts mounted through apertures in the planar mounting surface such that the handle is on the top side of the mounting surface and the retaining ends of the mounting shafts protrude through the bottom side of the mounting surface and retained in place by a retaining means to captivate the handle to the planar mounting surface;
   (d) biasing means between the retaining ends of the mounting shafts and the bottom side of the mounting surface, to bias the retaining ends of the mounting shaft away from the bottom side of the planar mounting surface; and
   (e) the handle adapted to facilitate axial movement of the shafts relative to and perpendicular to the planar mounting surface as the handle is rotated between the upright and folded positions, wherein when the handle is either in the upright position or folded position, the biasing means is under a compressive load, and during the transition from the upright to folded positions and the transition from folded to upright positions, the biasing means is under a greater compressive load than that when the handle is in the upright position or folded position.

2. The folding handle device of claim 1, wherein the compressive load of the biasing means when the handle is in the upright position is the same as the compressive load of the biasing means when the handle is in the folded position.

3. The folding handle device of claim 1, wherein the biasing means are coil springs.

4. The folding handle device of claim 1, wherein the biasing means are rubber grommet springs.

5. The folding handle device of claim 1, wherein each shaft is threaded and the retaining means are nuts.

6. The folding handle device of claim 1, wherein each shaft includes an integral pivot pin adapted to be received in a groove in each leg member.

7. The folding handle device of claim 1, wherein each shaft includes an integral pivot pin, an integral retaining means, and an integral biasing means.

8. A folding handle device, mountable to an article to be carried, the article having a generally planar mounting surface having top and bottom sides, the folding handle comprising:
   (a) a rotatable U-shaped handle having two leg members and a spanning member connecting the leg members, each leg member having a means adaptable to pivotally receive a mounting shaft, each leg member having a base having planar surfaces that enable the base to sit flush against the planar mounting surface in a plurality of positions, including a position in which the handle is upright and including a position in which the handle is folded parallel to the mounting surface;
   (b) two mounting shafts, each having a pivot end and a retaining end, each mounting shaft rotatably mounted to a base of the handle at the pivot end of the mounting shaft;
   (c) the retaining ends of the mounting shafts mounted through apertures in the planar mounting surface such that the handle is on the top side of the mounting surface and the retaining ends of the mounting shafts protrude through the bottom side of the mounting surface and retained in place by a nut to captivate the handle to the planar mounting surface;
   (d) a spring between the nut on the mounting shaft and the bottom side of the mounting surface, to bias the retaining ends of the mounting shaft away from the bottom side of the planar mounting surface;
   (e) the handle adapted to facilitate axial movement of the shafts relative to and perpendicular to the planar mounting surface as the handle is rotated between the upright and folded positions, wherein when the handle is either in the upright position or folded position, the springs are under a compressive load, and during the transition from the upright to folded positions and the transition from folded to upright positions, the springs are under a greater compressive load than that when the handle is in the upright position or folded position; and
   (f) wherein the compressive load of the springs when the handle is in the upright position is the same as the compressive load of the springs when the handle is in the folded position.

9. A folding handle device, mountable to an article to be carried, the article having a generally planar mounting surface having top and bottom sides, the folding handle comprising:
   (a) a rotatable handle having a leg member and a base, the leg member having a means adaptable to pivotally receive a mounting shaft, the base having planar surfaces that enable the base to sit flush against the planar mounting surface in a plurality of positions, including a position in which the handle is upright and including a position in which the handle is folded parallel to the mounting surface;
   (b) a mounting shaft having a pivot end and a retaining end, rotatably mounted to the base of the handle at the pivot end of the mounting shaft;
   (c) the retaining end of the mounting shaft mounted through an aperture in the planar mounting surface such that the handle is on the top side of the mounting surface and the retaining end of the mounting shaft protrudes through the bottom side of the mounting surface and is retained in place by a retaining means to captivate the handle to the planar mounting surface;
   (d) biasing means between the retaining end of the mounting shaft and the bottom side of the mounting surface, to bias the retaining end of the mounting shaft away from the bottom side of the planar mounting surface; and
   (e) the handle adapted to facilitate axial movement of the shaft relative to and perpendicular to the planar mounting surface as the handle is rotated between the upright and folded positions, wherein when the handle is either in the upright position or folded position, the biasing means is under a compressive load, and during the transition from the upright to folded positions and the transition from folded to upright positions, the biasing means is under a greater compressive load than that when the handle is in the upright position or folded position.

10. The folding handle device of claim 9, wherein the compressive load of the biasing means when the handle is in the upright position is the same as the compressive load of the biasing means when the handle is in the folded position.

11. The folding handle device of claim 9, wherein the biasing means is a coil spring.

12. The folding handle device of claim 9, wherein the biasing means is a rubber grommet spring.

13. The folding handle device of claim 9, wherein each shaft is threaded and the retaining means is a nut.

14. The folding handle device of claim 9, wherein the shaft includes an integral pivot pin adapted to be received in a groove in the leg member.

15. The folding handle device of claim 9, wherein the shaft includes an integral pivot pin, an integral retaining means, and an integral biasing means.

16. A folding handle device, mountable to an article to be carried, the article having a generally planar mounting surface having top and bottom sides, the folding handle comprising:

(a) a rotatable handle having a leg member and a base, the leg member having a means adaptable to pivotally receive a mounting shaft, the base having planar surfaces that enable the base to sit flush against the planar mounting surface in a plurality of positions, including a position in which the handle is upright and including a position in which the handle is folded parallel to the mounting surface;

(b) a mounting shaft having a pivot end and a retaining end, rotatably mounted to the base of the handle at the pivot end of the mounting shaft;

(c) the retaining end of the mounting shaft mounted through an aperture in the planar mounting surface such that the handle is on the top side of the mounting surface and the retaining end of the mounting shaft protrudes through the bottom side of the mounting surface and is retained in place by a nut to captivate the handle to the planar mounting surface;

(d) a spring between the nut of the mounting shaft and the bottom side of the mounting surface, to bias the retaining end of the mounting shaft away from the bottom side of the planar mounting surface; and (e) the handle adapted to facilitate axial movement of the shaft relative to and perpendicular to the planar mounting surface as the handle is rotated between the upright and folded positions, wherein when the handle is either in the upright position or folded position, the spring is under a compressive load, and during the transition from the upright to folded positions and the transition from folded to upright positions, the spring is under a greater compressive load than that when the handle is in the upright position or folded position, wherein the compressive load of the spring when the handle is in the upright position is the same as the compressive load of the spring when the handle is in the folded position.

* * * * *